US008347182B2

(12) United States Patent
Brown et al.

(10) Patent No.: US 8,347,182 B2
(45) Date of Patent: Jan. 1, 2013

(54) ENSURING DATA CONSISTENCY

(75) Inventors: Joanna K. Brown, Winchester (GB); Matthew J. Fairhurst, Winchester (GB); Mark B. Thomas, Romsey (GB)

(73) Assignee: International Business Machines Corporation, Armonk, NY (US)

( * ) Notice: Subject to any disclaimer, the term of this patent is extended or adjusted under 35 U.S.C. 154(b) by 804 days.

(21) Appl. No.: 12/489,832

(22) Filed: Jun. 23, 2009

(65) Prior Publication Data
US 2010/0005374 A1 Jan. 7, 2010

(30) Foreign Application Priority Data
Jul. 1, 2008 (EP) .................................... 08159420

(51) Int. Cl.
*G06F 11/10* (2006.01)
(52) U.S. Cl. ............... 714/764; 714/770; 714/805
(58) Field of Classification Search ............ 714/710, 714/764, 770, 805
See application file for complete search history.

(56) References Cited

U.S. PATENT DOCUMENTS

| 6,148,414 A * | 11/2000 | Brown et al. ........... 714/5.1 |
| 6,425,053 B1 * | 7/2002 | Considine et al. ....... 711/114 |
| 6,851,070 B1 * | 2/2005 | Rodrigues et al. ........ 714/5.11 |
| 7,278,067 B1 * | 10/2007 | Coatney et al. ............ 714/54 |
| 7,752,489 B2 * | 7/2010 | Deenadhayalan et al. ... 714/6.12 |
| 7,788,541 B2 * | 8/2010 | Shellhamer ................ 714/42 |
| 7,793,167 B2 * | 9/2010 | Hafner et al. ............. 714/54 |
| 8,006,111 B1 * | 8/2011 | Faibish et al. ............ 713/324 |
| 8,086,911 B1 * | 12/2011 | Taylor ..................... 714/54 |
| 8,140,752 B2 * | 3/2012 | Hart et al. ................ 711/114 |
| 2005/0028048 A1 * | 2/2005 | New et al. ................ 714/54 |
| 2008/0256420 A1 | 10/2008 | Hafner et al. |

OTHER PUBLICATIONS

"Background Patrol Read for Dell PowerEdge Raid Controllers", Dell Power Solutions, Feb. 2006, 3 pages.

* cited by examiner

*Primary Examiner* — Stephen M Baker
(74) *Attorney, Agent, or Firm* — Stephen J. Walder, Jr.; Randall J. Bluestone

(57) ABSTRACT

Mechanisms for ensuring data consistency in a data store are provided. The mechanisms access a parity scrub factor f and perform a check on a data group of the data store. The check on the data group includes performing a parity check on a portion of the data group, the portion being equal to $1/f$ of the data group, and performing a data verify on the remainder of the data group. The performing of the check is repeated for the entire data store. An offset factor is used to select the portion of the data group for the parity check. In this case, the offset factor may be incremented when the performance of the check on the data group of the data store has been repeated for the entire data store.

20 Claims, 5 Drawing Sheets

ENSURING DATA CONSISTENCY

BACKGROUND

This invention relates to mechanisms for ensuring data consistency in a data store. More specifically, the illustrative embodiments provide mechanisms for maintaining RAID consistency and performance through rate-adaptive parity checking.

RAID (Redundant Array of Independent Disks) is a technology that uses two or more hard disk drives. RAID is used to refer to computer data storage systems that divide and replicate data among multiple hard disk drives. RAID systems, in general, provide increased data reliability and increased input/output performance. When several physical disks are set up to use RAID technology, they are said to be in a RAID array. This array distributes data across several disks.

Some arrays are "redundant" in that extra data derived from the original data across the array is organized so that the failure of one (or sometimes more) disks in the array will not result in any loss of data. In this scenario, a bad disk is replaced by a new one and the data on the new disk can be reconstructed from the data on the other disks and the extra data. RAID arrays maintain access to data in the presence of disk errors either by means of redundant copies of data (for example in RAID levels 1 and 10), or by means of parity data computed from data stored on several disks (for example in RAID levels 5 and 6). It is desirable that these views of data are kept consistent. However, errors in the RAID software or drive firmware may cause these views of the data to become inconsistent. During normal operation parity is not used until it is needed and thus, without pro-actively seeking these latent inconsistencies they will not be found until it is too late and data has been lost.

Currently there are mechanisms to detect latent medium errors on disks. For example, in existing IBM products there background data scrubbing is performed where SCSI verify-read operations are sent to the disks over a period of several days, causing the disks to verify that the data on the disk platter is still readable. This does not detect whether the data is consistent with its redundant copies, or that the parity is consistent with the data.

There are also mechanisms to scan an array to compare the data with its redundant copies or parity. For example, in Linux software RAID, such an operation can be scheduled to run when the array is expected to be under low utilization, e.g., in the middle of the night, however this causes degradation of performance while the check is underway, similar to that caused by an array rebuild operation.

Improvements in ensuring data veracity have been proposed. For example, "Background Patrol Read", Dell Power Solutions February 2006 pages 73 to 75, discloses a system which is designed to proactively detect hard-drive media defects while an array is online and redundant, and then proceed to recover data. The tool provides data protection. This function concerns data reconstruction and remapping. Background Patrol Read issues commands to each drive in the array to test all sectors. When a bad sector is found, a controller instructs the hard drive to reassign the bad sector, and then reconstructs the data using the other drives. The affected hard drive then writes data to the newly assigned good sector. These operations continue so that all sectors of each configured drive are checked, including hot spares. As a result, bad sectors can be remapped before data loss occurs.

The problem with systems such as these lies in the bandwidth that is taken up by such background tasks.

SUMMARY

In one illustrative embodiment a method, in a data processing system, for ensuring data consistency in a data store of the data processing system. The method comprises accessing, by a processor of the data processing system, a parity scrub factor f that is a multiplicative factor for a time that is used to perform a parity check operation compared to a data check operation. The method further comprises performing, by the processor, a check on a data group of a sector of an individual disk of the data store, the data group being less than an entire amount of data stored in the data store. Moreover, the method comprises outputting, by the processor, a result of the check on the data group in response to the check indicating an error in parity of the data group. Performing the check on the data group comprises performing, by the processor, a parity check on a portion of the data group, the portion being equal to 1/f of the data group, and performing, by the processor, a data verify on a remainder of the data group.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise a processor and a data store coupled to the processor. The processor performs various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
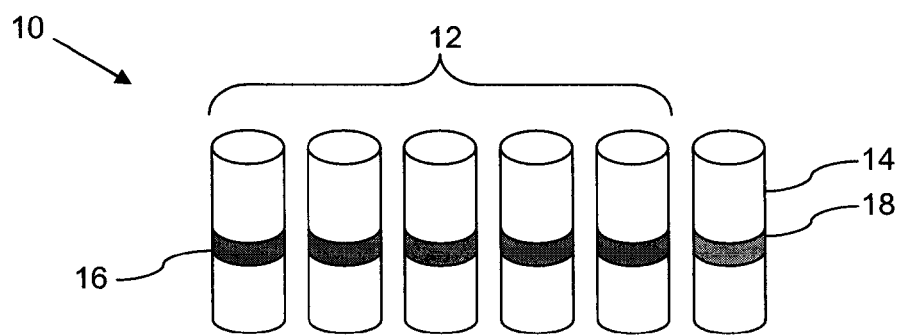
FIG. 1 is a schematic diagram of a data store.

A data store 10 is illustrated in FIG. 1, being a RAID array of data disks 12 and a parity disk 14. Data (shown schematically as a sector 16) is stored in the data disks 12, and corresponding parity data 18 is stored in the parity disk 14. The parity data 18 is generated using a well-defined parity function, and allows the data in any individual sector 16 to be recreated if it is lost or corrupted. This data restoration is achieved by accessing the data in the corresponding sectors 16, in the other disks 12, and also the corresponding parity data 18, and recalculating the lost data using the well-defined parity function or a suitable inverse function.

In the normal operation of the RAID array 10, where all sectors are operating correctly, the parity data 18 should be consistent with the data 16 on the disks 12, according to the structure of the well-defined parity function. A parity check is the step of checking this consistency, for a specific data group. The size of this data group will depend upon the specifics of the parity check being carried out. The data group may be a whole sector of a disk 12, or some other pre-defined data size. To perform a parity check, the data group being tested is read, as well as all of the corresponding data groups on the other data disks 12. In addition, the corresponding data group of the parity disk 14 is read and the well-defined parity function is used to determine if the expected parity data 16 matches the actual stored parity data 16.

It can be seen from the above, that the performance of a parity check is a relatively intensive task in terms of the bandwidth required to perform the parity check. Every single disk 12 and the parity disk 14 are accessed, with data on all of the disks 12 and 14 being read. Indeed, to perform a parity check on the entire data being stored by the data store 10, in many real implementations of RAID arrays, the parity check operation would take many days to complete. Known solutions to the problem of successfully performing a parity check on an entire data store either attempt to carry out the check during low usage time (such as at night) or use adaptive techniques to adapt the process to the current load being placed on the RAID array. Neither of these solutions is ideal in terms of ensuring that the parity check is consistently carried out in a predictable manner.

The illustrative embodiments provide a rate adaptive background parity check. A background data check algorithm existing in the current implementation is extended to include a parity check phase, where instead of issuing SCSI verify-reads, ordinary SCSI reads are issued to all the data and parity disks 12 and 14. The data and parity are then checked to ensure they are consistent. For small systems, this process is done at the same rate as the data check operation. There is no increase in load on the disks as a data check would have occurred anyway. There is additional use of the network connecting the RAID controller to the disks and additional use of the RAID controller's DMA and parity computation engines, however, these do not generate bottlenecks in performance of the system. In these systems, parity is scrubbed at the same rate as data.

For larger systems where the network, Direct Memory Access (DMA), and parity computation are considered bottlenecks to performance, it is important to reduce the rate at which a parity check is performed in order not to introduce additional negative affects on performance and thereby maintain performance of the system. This is achieved by introducing a parity scrub factor (f), which is a multiplicative factor for the time that is used to perform a parity check compared to a data check operation.

Figure 2:
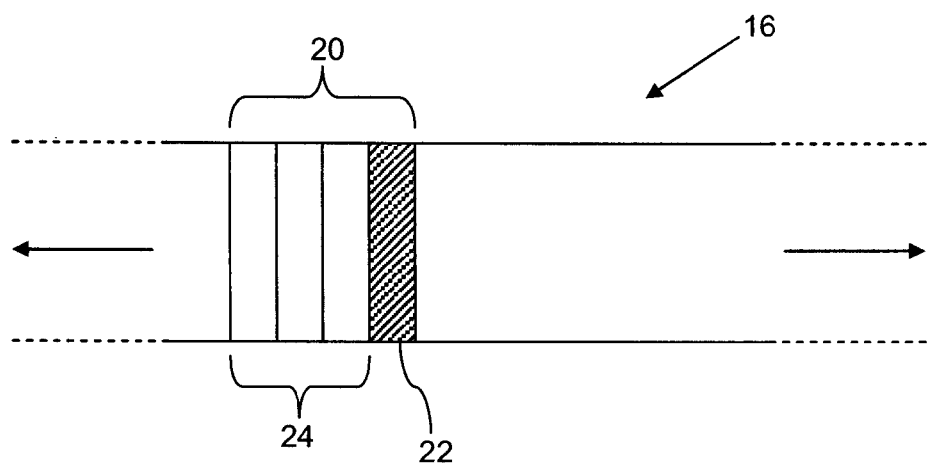
FIG. 2 is a schematic diagram of a data group for explaining a data verify and parity check operation in accordance with one illustrative embodiment.

FIG. 2 illustrates an example of a data group for explaining a combined data verify and parity check operation in accordance with one illustrative embodiment. Here a part of a sector 16 of an individual disk 12 of the RAID array 10 is shown. A data group 20 is shown in FIG. 2 as being comprised of four strides, where a stride is a unit of work for the verification process. The size of the stride and the number of strides in a data group 20 is not important to the operation of the checking process. The method of ensuring data consistency in the data store 10 comprises accessing the parity scrub factor f, and thereby performing a check on the data group 20. The check on the data group 20 includes performing a parity check on a portion 22 of the data group 20, that portion being equal to 1/f of the data group 20, and performing a data verify on the remainder 24 of the data group 20.

It can here be seen in FIG. 2 that, in this example f=4, that as the data verification process is used on the strides within the arrays, ¼ of the strides will have a parity check performed on them instead of the data verify operation. As the combined data check and parity check process progresses through the RAID array 10, the parity of one stride in every group of f strides is "parity scrubbed." The remaining strides in this group are merely "data scrubbed" using SCSI verify-reads. The performing of a check on the data of the data store 10 is carried for the entire data store 10. The parity check operation that is combined with the data check operation in accordance with the illustrative embodiments is referred to herein as the "extended parity scrub process."

In order to track the progress of the extended parity scrub process, the process augments the data scrub position with a parity scrub offset "o." The component that is controlling the check on the data consistency will access the offset factor and select the portion 22 of the data group 20 for the parity check according to the offset factor. The offset factor is incremented in response to the combined data and parity check operation being performed on all data groups 20 of the entire data store 10, i.e. the combined data and parity check operation has been repeated for the entire data store 10 for a given offset factor. The combined data and parity check operation may then be performed subsequently for data groups 20 of the entire data store 10 with a different offset factor thereby causing different strides of the data groups 20 being subjected to parity check operations.

The parity scrub factor f can be selected dynamically based on the cumulative size of all the arrays 12 in the system 10 that are performing the parity scrub. Moreover, the parity scrub factor f can be selected dynamically based on knowledge of the expected performance of the system 10 and the effects on that performance of the scrub operations. It is expected that the parity scrub factor f increases as arrays 12 are created, and decreases when arrays 12 are deleted.

Because the parity scrub factor f may change several times during the duration of a single pass of data scrub through the data store 10, it is important to ensure that progress is made even when the parity scrub factor f is repeatedly changing between two values. If there is a reset of the parity scrub offset o whenever the factor changes, a parity scrub of a latter part of each data group may never be performed, as it is conceivable that there is a repeated restart of the parity scrub operation. For this reason, in one illustrative embodiment, the offset factor o is stored as a fraction, which is representing a relative fractional position through each group of strides. When a single pass of data scrub completes, the parity scrub offset o is increased to the next multiple of 1/f that is strictly greater than o. When o reaches 1, it is reset to 0. For each group of m strides, the portion of the strides that is parity scrubbed is the portion where a corresponding stride number within the data group, n, satisfies the condition that: floor(of)=floor((n*f)/m).

Figure 3:
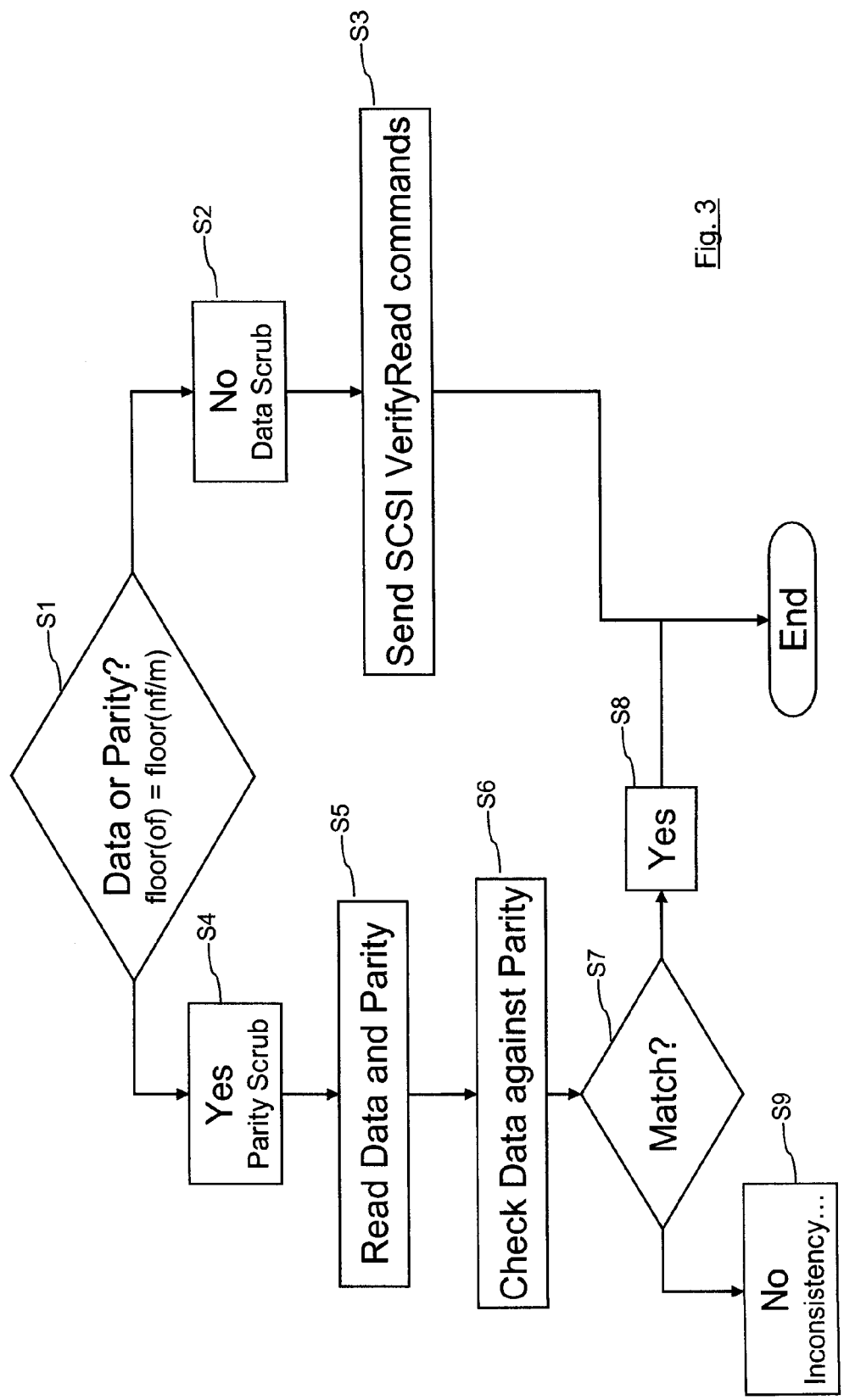
FIG. 3 is a flowchart of an example operation for ensuring data consistency in the data store using a combined data and parity check operation in accordance with one illustrative embodiment.

An example of the method of performing the combined data and parity check operation to ensure data consistency in the data store 10 is shown in FIG. 3. In one illustrative embodiment, the process shown in FIG. 3 is triggered by a scheduler clock event. A scheduler is configured to inform the relevant processing component when it is time to scrub a stride or a group of strides. The flowchart of FIG. 3 shows the process operating through one stride. The entire process will be repeated for the multiple strides that make up the data group 20 that is being checked.

Initially, a determination is made as to whether a data verify operation is to be performed or whether a full parity check operation is to be performed (step S1). The parity scrub factor f is accessed, along with the offset factor o, to determine the outcome of this determination. If it a parity check is not to be performed, then a data scrub operation is performed (step S2), such as by sending a SCSI VerifyRead command to the relevant stride (step S3). The process then terminates. The handling for medium errors on Read and VerifyRead commands is not shown for simplicity. This should be the same as for existing read operations.

However, if it is determined that a parity check operation should be performed on the current stride (S1), then a parity check is initiated (S4). The data in the stride is read along with all other necessary data from corresponding strides and the parity data (S5). A parity check is made on this data with the well-defined parity function, in order to see if there is data consistency for the stride being tested (S6). A determination is made as to whether a result of the parity check is that there is a match or not (S7). If the answer is yes, then no further action is taken (S8) and the process terminates. If there is no match, then an output is generated which indicates inconsistency for the currently tested stride (S9). This mismatch can then be corrected or an administrator can be alerted, in order to take corrective action.

The above description assumes a smooth running through all of the strides within the data store 10 in order. However, there may be reasons to alter the order in which the strides are processed in the combined data and parity check operation for consistency errors. For example, a biasing of these data parity check operations to strides that have been recently written to may be used. In such a situation, it can be seen that, in order to maintain performance with this biasing in place, the number of check operations for recent writes may also be scaled using the parity scrub factor. However, in this case the characteristic that only a proportion of the checks are parity checks is maintained.

It is also desirable, after detecting an inconsistency in any data group 20, to disable writes to the data group 20 that are below a predetermined fixed size. This prevents further contamination of inconsistent strides. Once a stride is inconsistent, further short writes to that stride may cause the situation to worsen. If an inconsistent parity is used to partially reconstruct some of the data, the data may be replaced with garbage data. In order to prevent this from occurring, once an inconsistency is discovered through the mechanisms of the illustrative embodiments, an indication of the inconsistency is stored within the array's metadata. From that point on, short writes are disabled to this stride, returning an error condition indicating the parity is invalid. In order to clear this error condition the user of the array must submit a long write covering the whole stride, so that new, correct parity data can be calculated from known good data, and the inconsistency fixed.

Figure 4:
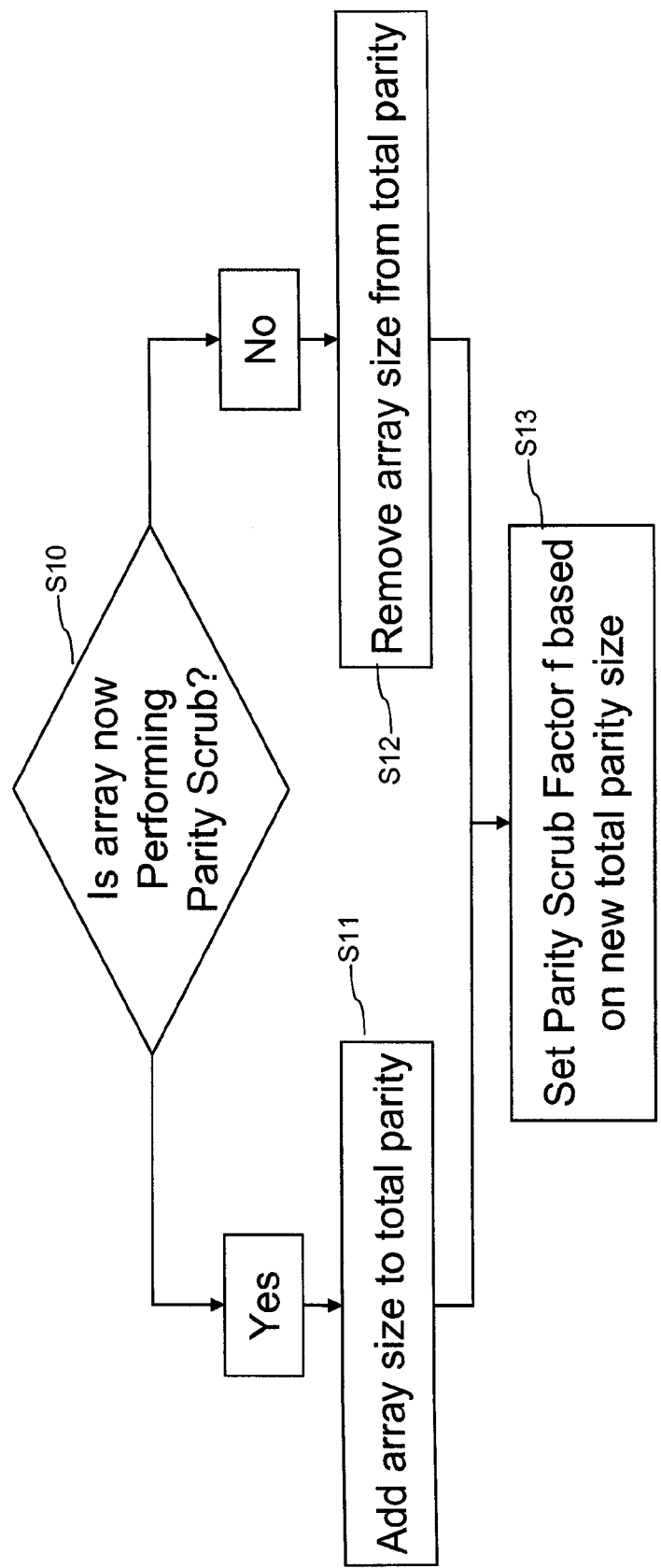
FIG. 4 is a flowchart of an example operation for handling an array change in accordance with one illustrative embodiment.

One advantage of the above methodology of conducting the parity checks is that it will still continue to function if there is any change in the data store 10. For example, array creation, deletion and state changes can be accommodated within the methodology, without sacrificing any of the effectiveness of the parity check, and without affecting the ability to scan through the entire data store 10 in turn. FIG. 4 shows a flowchart that details the handling of an array change. As shown in FIG. 4, a check is made to see if a parity check, or scrub, is currently being performed (S10). If yes, then the array size is added to the total parity (S11) and, if no, then the array size is removed from the total parity (S12). Either route terminates at the step S13, where a new parity scrub factor f is calculated based upon the new array size. As the array size increases, then in general it is better to increase the factor f, which will result in a lower proportion of the strides being parity checked for the larger array.

Figure 5:
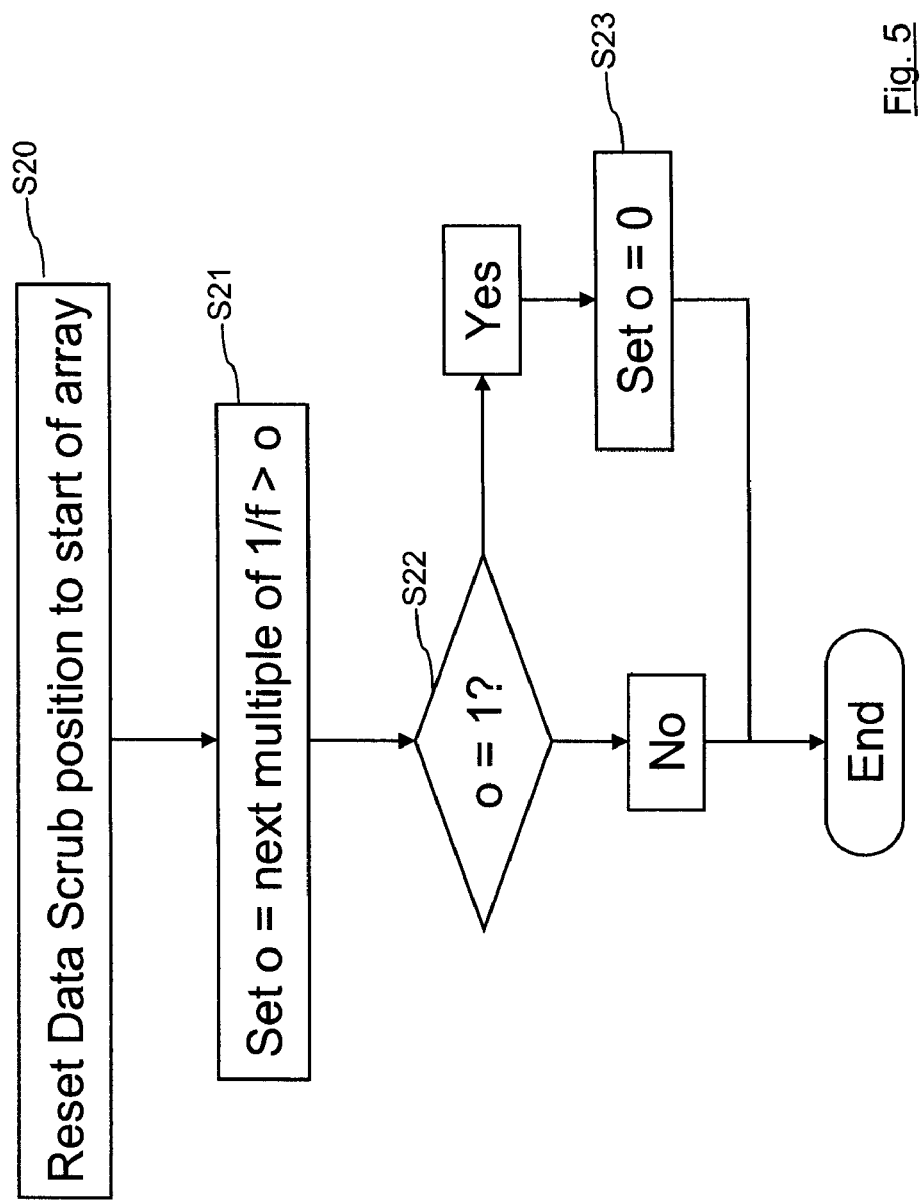
FIG. 5 is a flowchart of an example operation for incrementing an offset factor in accordance with one illustrative embodiment.

As mentioned above, the offset factor o is used to position the parity check operation within the strides of the data group being checked. Once the entire data stored by the RAID array 10 has been finished, then a mechanism increments the offset factor o to ensure that in the next run through the data stored in the store 10, a different part of each data check has the parity check performed thereon. The flowchart of FIG. 5 shows this mechanism in accordance with one illustrative embodiment. Once the entire array 10 has been scrubbed, then the scheduling pointer is reset to the start of the array (S20). The value of the offset factor o is raised to the next integer multiple of 1/f that is >0 (S21). The value of the offset factor o is checked to see if it is =1 (S22). If not, then the process terminates. If o=1, then the process sets o=0 (S23) and then terminates.

Figure 6:
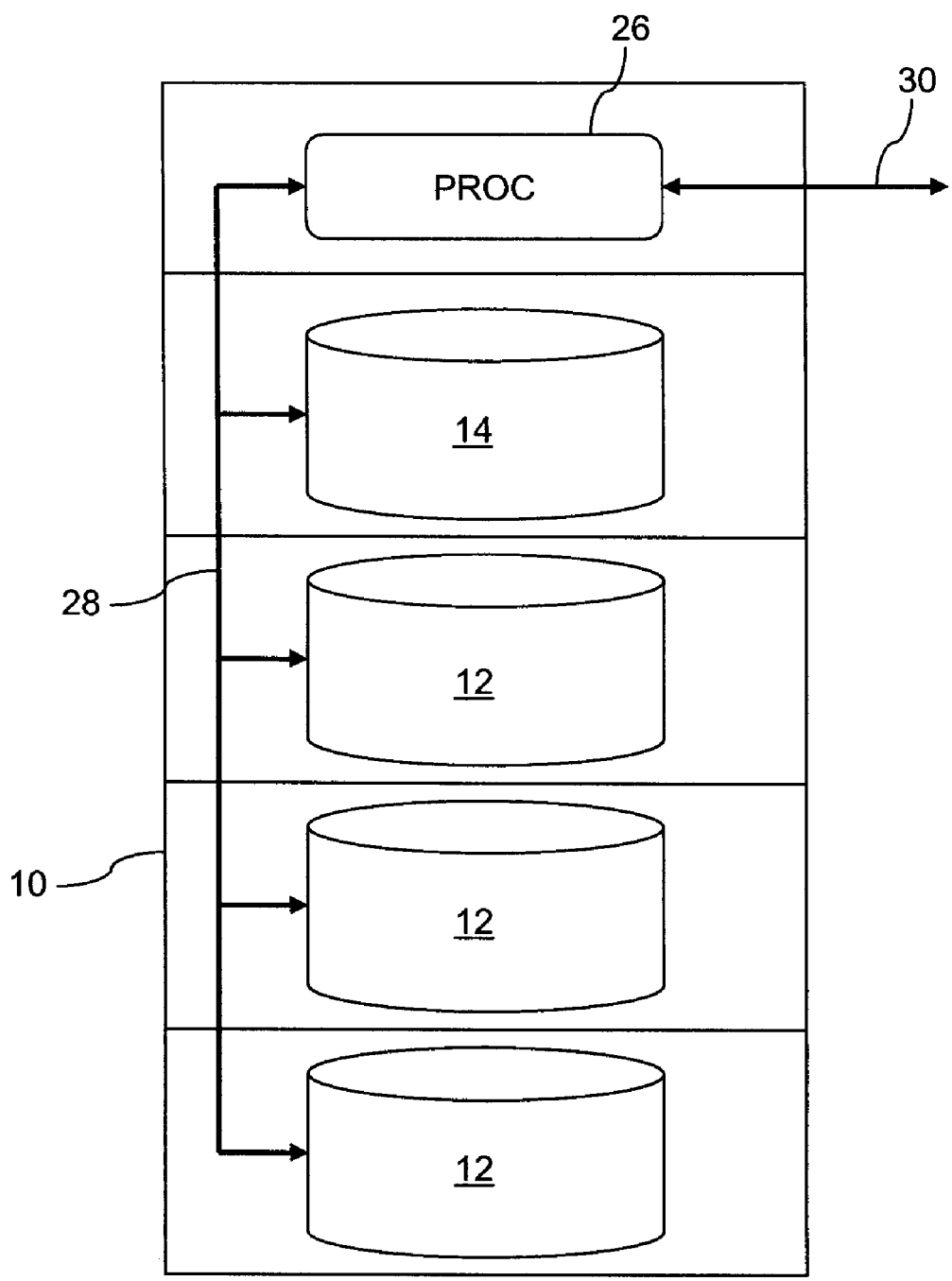
FIG. 6 is a further example schematic diagram of the data store of FIG. 1 in accordance with one illustrative embodiment.

FIG. 6 shows a further view of the RAID array 10, in an actual cabinet with data disks 12 and the parity disk 14. A processor 26 communicates with the disks 12 and 14 via an internal bus 28, and externally via an external bus 30. The processor 26 is arranged to carry out the data and parity checks in accordance with the illustrative embodiments described above. The processor 26 accesses the parity scrub factor f, and performs the checks on the data groups of the data store 10, as discussed above in detail. The processor 26 performs a parity check on a portion of each data group, the portion equal to 1/f of the data group, and performs a data verify on the remainder of each data group.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

The invention claimed is:

1. A method in a data processing system, for ensuring data consistency in a data store of the data processing system, comprising:
accessing, by a processor of the data processing system, a parity scrub factor f that is a multiplicative factor for a time that is used to perform a parity check operation compared to a data check operation;
performing, by the processor, a check on a data group of a sector of an individual disk of the data store, the data group being less than an entire amount of data stored in the data store; and outputting, by the processor, a result of the check on the data group in response to the check indicating an error in parity of the data group, wherein performing the check on the data group comprises:
performing, by the processor, a parity check on a portion of the data group, the portion being equal to 1/f of the data group, and
performing, by the processor, a data verify on a remainder of the data group.

2. A method according to claim 1, further comprising:
detecting an inconsistency in the data group; and
disabling writes to the data group below a predetermined fixed size in response to detecting the inconsistency in the data group.

3. A method according to claim 1, further comprising:
accessing an offset factor that identifies an offset position within the data group where the portion of the data group, on which the parity check is performed, is located; and
selecting the portion of the data group for the parity check according to the offset factor.

4. The method of claim 1, wherein the parity check on the portion of the data group is at a same rate as the remainder of the data group.

5. A method according to claim 1, and further comprising repeating the performing of a check on a data group of the data store, for additional data groups until the entire data store is checked.

6. A method according to claim 5, further comprising:
accessing an offset factor that identifies an offset position within the data group where the portion of the data group, on which the parity check is performed, is located; and
selecting the portion of the data group for the parity check according to the offset factor.

7. A method according to claim 6, further comprising incrementing the offset factor in response to completion of the check on the additional data groups of the data store.

8. A system for ensuring data consistency in a data store comprising:
a processor; and
a data store coupled to the processor, wherein the processor:
accesses a parity scrub factor f that is a multiplicative factor for a time that is used to perform a parity check operation compared to a data check operation;
performs a check on a data group of a sector of an individual disk of the data store, the data group being less than an entire amount of data stored in the data store; and
outputting a result of the check on the data group in response to the check indicating an error in parity of the data group, wherein processor performs the check on the data group by:
performing a parity check on a portion of the data group, the portion being equal to 1/f of the data group, and
performing a data verify on a remainder of the data group.

9. A system according to claim 8, wherein the processor further:
detects an inconsistency in the data group; and
disables writes to the data group below a predetermined fixed size in response to detecting the inconsistency in the data group.

10. A system according to claim 8, wherein the processor further:
accesses an offset factor that identifies an offset position within the data group where the portion of the data group, on which the parity check is performed, is located; and
selects the portion of the data group for the parity check according to the offset factor.

11. The system of claim 8, wherein the parity check on the portion of the data group is at a same rate as the remainder of the data group.

12. A system according to claim 8, wherein the processor further repeats the performing of the check on the data group of the data store, for additional data groups until the entire data store is checked.

13. A system according to claim 12, wherein the processor further:
accesses an offset factor that identifies an offset position within the data group where the portion of the data group, on which the parity check is performed, is located; and
selects the portion of the data group for the parity check according to the offset factor.

14. A system according to claim 13, wherein the processor further:
increments the offset factor in response to completion of the check on the additional data groups of the data store.

15. A computer program product on a non-transitory computer readable medium for ensuring data consistency in a data store, the product comprising instructions for:
accessing a parity scrub factor f that is a multiplicative factor for a time that is used to perform a parity check operation compared to a data check operation;
performing a check on a data group of a sector of an individual disk of the data store, the data group being less than an entire amount of data stored in the data store; and
outputting a result of the check on the data group in response to the check indicating an error in parity of the data group, wherein performing the check on the data group comprises:
performing a parity check on a portion of the data group, the portion being equal to 1/f of the data group, and
performing a data verify on a remainder of the data group.

16. A computer program product according to claim 15, further comprising instructions for detecting an inconsistency in the data group and disabling writes to the data group below a predetermined fixed size in response to detecting the inconsistency in the data group.

17. A computer program product according to claim 15, and further comprising instructions for:
accessing an offset factor that identifies an offset position within the data group where the portion of the data group, on which the parity check is performed, is located; and
selecting the portion of the data group for the parity check according to the offset factor.

18. A computer program product according to claim 15, and further comprising instructions for repeating the performing of the check on the data group of the data store, for additional data groups until the entire data store is checked.

19. A computer program product according to claim 18, and further comprising instructions for:
accessing an offset factor that identifies an offset position within the data group where the portion of the data group, on which the parity check is performed, is located; and selecting the portion of the data group for the parity check according to the offset factor.

20. A computer program product according to claim 19, and further comprising instructions for incrementing the offset factor in response to completion of the check on the additional data groups of the data store.

* * * * *